(12) United States Patent
Madge et al.

(10) Patent No.: US 6,598,194 B1
(45) Date of Patent: Jul. 22, 2003

(54) TEST LIMITS BASED ON POSITION

(75) Inventors: Robert J. Madge, Portland, OR (US); Emery Sugasawara, Pleasanton, CA (US); W. Robert Daasch, West Linn, OR (US); James N. McNames, Portland, OR (US); Daniel R. Bockelman, Portland, OR (US); Kevin Cota, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 561 days.

(21) Appl. No.: 09/641,661

(22) Filed: Aug. 18, 2000

(51) Int. Cl.⁷ .................................................. G06F 11/00
(52) U.S. Cl. ...................................... 714/745; 714/735
(58) Field of Search ................................... 714/745, 718, 714/735; 209/587; 700/223; 356/375; 716/5; 438/17; 324/765

(56) References Cited

U.S. PATENT DOCUMENTS

| | | | | |
|---|---|---|---|---|
| 5,497,381 A | * | 3/1996 | O'Donoghue et al. | 714/745 |
| 5,903,341 A | * | 5/1999 | Perry et al. | 209/587 |
| 6,009,545 A | * | 12/1999 | Tsutsui et al. | 714/718 |
| 6,055,463 A | * | 4/2000 | Cheong et al. | 700/223 |
| 6,097,492 A | * | 8/2000 | Kondo et al. | 356/375 |
| 6,102,962 A | * | 8/2000 | Sugasawara et al. | 716/5 |
| 6,119,250 A | * | 9/2000 | Nishimura et al. | 714/718 |
| 6,136,618 A | * | 10/2000 | Sanada | 438/17 |
| 6,342,790 B1 | * | 1/2002 | Ferguson et al. | 324/765 |

OTHER PUBLICATIONS

*An Histogram Based Procedure for Current Testing of Active Defects*, Thibeault, ITC International Test Conference, 1999.
*Clustering Based Techniques for IDDQ Testing*, Jandhyala et al., ITC International Test Conference, 1999.
*Current Rations: A Self–Scaling Technique for Production IDDQ Testing*, Maxwell et al., ITC international Test Conference 1999.

*IDDQ Defect Detection in Deep Submicron CMOS IC's*, Kundu.

*A Comprehensive Wafers Oriented Test Evaluation Scheme for the IDDQ Testing of Deep Sub–Micron Technologies*, Singh.

*On the Comparison of Delta IDDQ and IDDQ Testing*, Thibeault.

* cited by examiner

Primary Examiner—David Ton
(74) Attorney, Agent, or Firm—Luedeka, Neely & Graham, P.C.

(57) ABSTRACT

A method for testing integrated circuits having associated position designations, where a predetermined set of input vectors is introduced as test input into the integrated circuits. The output from the integrated circuits in response to the predetermined set of input vectors is sensed, and the output from the integrated circuits is recorded in a wafer map, referenced by the position designations. The output from at least a subset of the integrated circuits is selected and mathematically manipulated to produce a reference value. The output for each of the integrated circuits in the selected subset is individually compared to the reference value, and graded integrated circuits within the selected subset that have output that differs from the reference value by more than a given amount are identified. A classification is assigned to the graded integrated circuits and recorded in the wafer map, referenced by the position designations for the graded integrated circuits.

20 Claims, 5 Drawing Sheets

TEST LIMITS BASED ON POSITION

FIELD

This invention relates to the field of testing integrated circuits. More particularly the invention relates to a system for determining different failure limits for various electronic characteristics of integrated circuits based on selected subsets of the integrated circuits.

BACKGROUND

Integrated circuit fabrication is an extremely complex process. Therefore, the various processes used to fabricate integrated circuits are often categorized in some manner, in order to simplify the description of the various phases of fabrication. For example, the various steps employed to create the integrated circuits while they are disposed upon a monolithic substrate is often called wafer processing. After wafer processing, the devices are tested for conformance to predicted parameters in what may be called wafer testing. After wafer testing the circuits are diced and then integrated circuits that have been binned as "good" circuits are packaged.

Typically, an individual integrated circuit on the wafer is binned as good or bad during wafer testing. The wafer testing equipment is programmed to run a regimen of tests on each integrated circuit by applying known electrical input on the electrical contact pads of the integrated circuit. The electrical response of the integrated circuit to the input is sensed and measured at the output electrical contact pads of the integrated circuit. The measured output values are compared to a set of predetermined expected output values, and if any of the measured output values violate the corresponding predetermined expected output values, such as by being either greater than or less than the predetermined expected output value as the case may be, then the integrated circuit is binned by the automated wafer tester as bad.

When the circuit is designated as bad, a drop of ink is typically placed atop the circuit by the wafer tester. After the integrated circuits are diced, the pick and place unit that removes the individual integrated circuits and places them into packages detects the ink drop on the bad integrated circuits, and skips them so that they are not placed into packages and processed further. The inked integrated circuits that are left on the dicing tape by the pick and place are then discarded.

The predetermined expected output values are typically determined by correlating output values for a large number of packaged devices. The packaged devices are tested to see whether they function properly or whether they fail prematurely. The output values for those devices that either do not function at all or fail prematurely are studied, and a predetermined expected output value is selected such that most of the devices with output values that do not violate the predetermined expected output value function properly for a desired length of time, and most of the devices with output values that do violate the predetermined expected output value either do not function properly for the desired length of time or do not function properly.

Unfortunately, this method of setting expected output values is extremely imprecise. Some of the devices that violate the predetermined expected output value function properly for the desired length of time, and some of the devices that do not violate the predetermined expected output value do not function properly for the desired length of time.

Thus, this traditional method of wafer testing and binning is extremely inflexible and does not account for the individual characteristics of an integrated circuit on the wafer. For example, the automated wafer tester has no way of knowing whether the output value received from the tested integrated circuit is a value that should be expected from the integrated circuit, based on the specific processing received by that integrated circuit. Thus, some amount of integrated circuits that are actually good are binned as bad, and some amount of integrated circuits that are actually bad are binned as good. Further, once the automated wafer tester bins an specific integrated circuit as bad and places an ink drop on it, there is no easy way to go back to and review the test data and reclaim the integrated circuit.

What is needed, therefore, is a system to bin integrated circuits in response to binning limits that are based upon expected output values that take into account specific processing received by the integrated circuits, rather than upon predetermined expected output values. Further, a system is needed that provides flexibility in binning the integrated circuits in response to the binning limits.

SUMMARY

The above and other needs are met by a method for testing integrated circuits having associated position designations, where a predetermined set of input vectors is introduced as test input into the integrated circuits. The output from the integrated circuits in response to the predetermined set of input vectors is sensed, and the output from the integrated circuits is recorded in a wafer map, referenced by the position designations. The output from at least a subset of the integrated circuits is selected and mathematically manipulated to produce a reference value. The output for each of the integrated circuits in the selected subset is individually compared to the reference value, and graded integrated circuits within the selected subset that have output that differs from the reference value by more than a given amount are identified. A classification is assigned to the graded integrated circuits and recorded in the wafer map, referenced by the position designations for the outlier integrated circuits.

In this manner, the normal degree of variation within various subsets of integrated circuits, preferably within different regions of a wafer, is taken into account in determining which of the integrated circuits are to be assigned codes, such as failure codes, and which of the integrated circuits are to pass. In other words, variation in processing conditions across the surface of a wafer may produce a difference in various electrical characteristics of the integrated circuits across the surface of the wafer. These regional differences may result in a high degree of variance in the test values for the electrical characteristic in question. By selecting subsets of the integrated circuits for separate analysis, the variance due to processing differences across the surface of the wafer can be more fully removed, and the true outlier integrated circuits within a selected subset can be more easily identified. The graded integrated circuits identified in this manner tend to be outliers because of defects, rather than because of regional differences in processing conditions across the surface of the wafer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIGS. 4A and 4B depict a selection scheme for a subset of integrated circuits.

DETAILED DESCRIPTION

Figure 2:
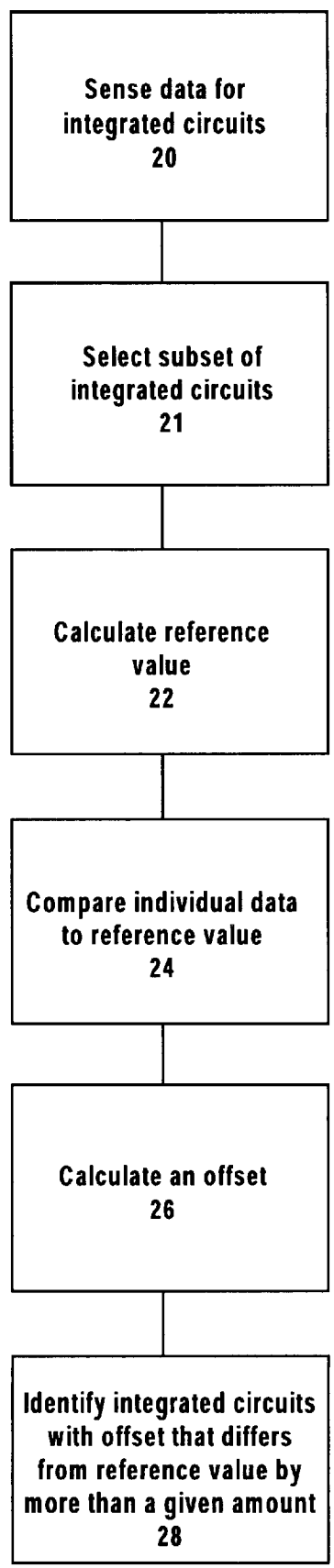
FIG. 2 is a flow chart of a method for binning integrated circuits as passing or failing.

Turning now to the drawings, FIG. 2 depicts an overview of a method according to the system, where the data for the integrated circuits is sensed in step 20 and a subset of the integrated circuits is selected in step 21. The individual data within the selected subset is compared to a reference value in step 24, and an offset of the individual data from the reference value is calculated in step 26. In step 28, each offset is compared to a given amount to determine the graded integrated circuits, which are binned. These steps are described in greater detail below.

Figure 1:
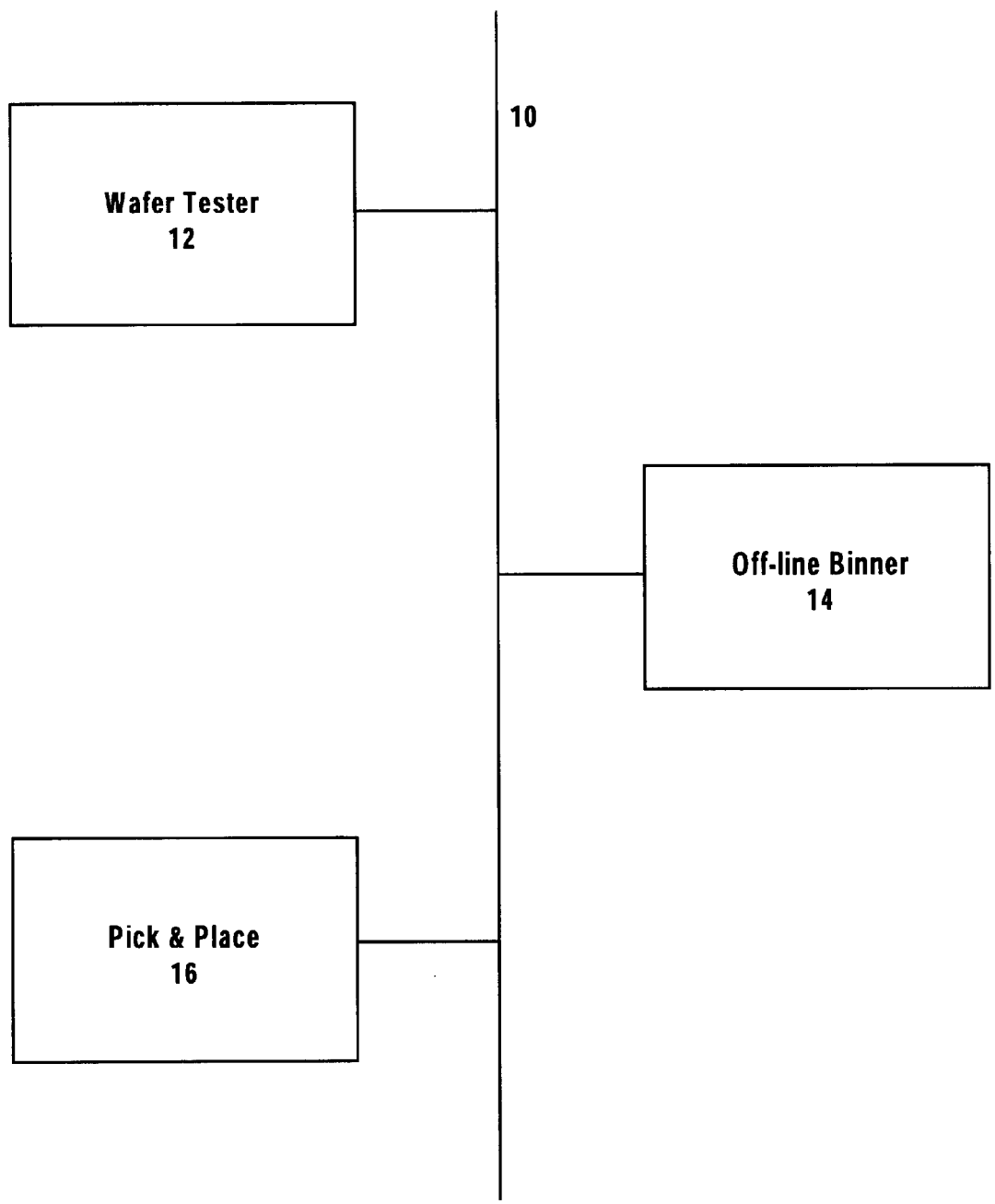
FIG. 1 is a functional block diagram of an off-line binning system.

FIG. 1 depicts a functional block diagram of a system according to the present invention. Block 12 represents a wafer tester, such as those commonly used in the industry, where the various electrical characteristics of an integrated circuit are tested, preferably while the integrated circuit is still in wafer form. Network 10 represents communication between the wafer tester 12 and the other components of the system, as described below. The network 10 may be a computerized electronic network with associated mass storage, or it may be discrete data storage, such as a floppy disk.

In a most preferred embodiment, the electrical characteristics of the integrated circuits are sensed by the wafer tester 12, but the integrated circuits are not binned as to passing or failing. However, in alternate embodiments, the wafer tester 12 is programmed with pass and fail limits, as is standard in the industry, and outputs files to the network 10 that include bin data. It is preferred, however, that the wafer tester 12 not ink any of the integrated circuits that it bins as failures. In this manner, the integrated circuits that are binned as failures by the wafer tester 12 are more easily recovered if they are subsequently rebinned as passing devices at a later stage in the system.

Preferably, the data that is output by the wafer tester 12 is referenced in some manner to the position on the wafer of the integrated circuit from which it was sensed. In a most preferred embodiment this is accomplished by writing the data records to the network 10 with row and column references to the integrated circuits, as they are laid out on the wafer in a standard orientation, as determined by wafer flats or other persistent geographical features of the wafer.

The data relating to the electrical characteristics of the integrated circuits is read in to an off-line binner 14. The off-line binner 14 can receive the data in a variety of ways, primarily dependant upon the form-of output used by the specific wafer tester 12 in use. For example, if the wafer tester 12 outputs the data to a mass storage device located on the network 10, then the off-line binner 14 can read the data from the mass storage device via a similar network connection. Alternately, if the wafer tester 12 produces the output on a floppy disk, then the off-line binner 14 is preferably provided with and reads the floppy disk created by the wafer tester 12.

The output from the wafer tester 12 is preferably received by the off-line binner 14 in files that contain all of the data for all of the integrated circuits on a single wafer. However, as mentioned above, the differences in processing conditions across the surface of the wafer may produce differences in the values of the electrical characteristics for the individual integrated circuits across the surface of the wafer. These differences, if not accounted for in some manner, may result in binning as bad some of the integrated circuits that are good and binning as good some of the integrated circuits that are bad. Thus, in the preferred embodiment of a method according to the present invention, the output for the wafer, and perhaps even for many wafers, such as all the wafers in a lot or all the wafers processed over a given period of time, is analyzed to determine whether one or more of certain regional patterns may exist across the surface of the wafer. If detected, the output form these regional patterns is preferably considered separately in the further analysis described below.

Figure 5A:
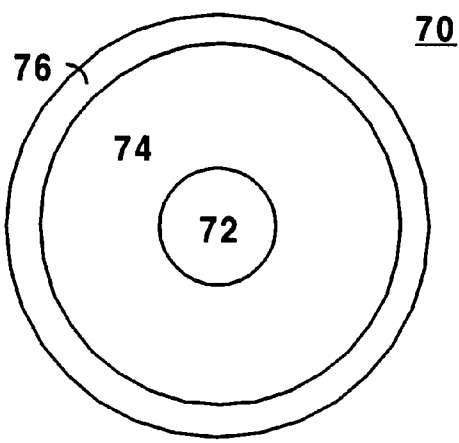
FIGS. 5A through 5F depict alternate selection schemes for a subset of integrated circuits.

For example, with reference to FIG. 5A, there is depicted a wafer 70 where the values for the sensed electrical characteristics of the individual integrated circuits on the wafer 70 vary by concentric annular region. It is appreciated that even though the annular regions depicted in FIG. 5A are very uniform and have very smooth edges, in actual application the regions may not be so uniform or have such smooth edges. Thus, the depiction of FIG. 5A is for purposes of example only, and is not intended to limit the scope of the application of the invention to the exact example depicted.

To continue the example, the electrical characteristics of the integrated circuits within region 72 of the wafer 70 may have values that are generally higher than those within region 74 of the wafer 70. Further, the electrical characteristics of the integrated circuits within region 76 of the wafer 70 may have values that are also statistically distinguishable, whether it be higher or lower, than either or both of those of the regions 72 and 74. Because of the difference in the values of the electrical characteristics of the integrated circuits within these various regions, consideration of all of the values as a single group may tend to falsely indicate a high degree of variability within the overall group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 72, 74, and 76 are selected as separate subsets before continuing with the analysis of the integrated circuits within the regions.

Figure 5B:
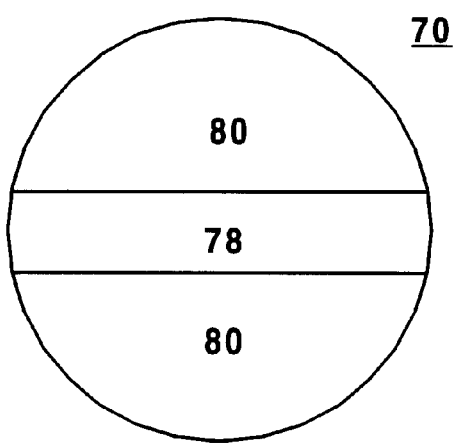

With reference to FIG. 5b, there is depicted a wafer 70 where the values for the sensed electrical characteristics of the individual integrated circuits on the wafer 70 vary by linear banded region. It is appreciated that even though the linear banded regions depicted in FIG. 5B are very uniform and have very smooth edges, in actual application the regions may not be so uniform or have such smooth edges. Further, the linear banded region 78 is depicted in FIG. 5B as a horizontal band. However, this again is merely representational, and the banded region 78 may be a vertical band or a band of any other orientation and width. Thus, the depiction of FIG. 5B is for purposes of example only, and is not intended to limit the scope of the application of the invention to the exact example depicted.

To continue the example, the electrical characteristics of the integrated circuits within region 78 of the wafer 70 may have values that are generally higher than those within regions 80 of the wafer 70. Because of the difference in the values of the electrical characteristics of the integrated circuits within these regions, consideration of all of the values as a single group may tend to falsely indicate a high degree of variability within the group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 78 and 80 are selected as separate subsets before continuing with the analysis of the integrated circuits within the regions.

Figure 5C:
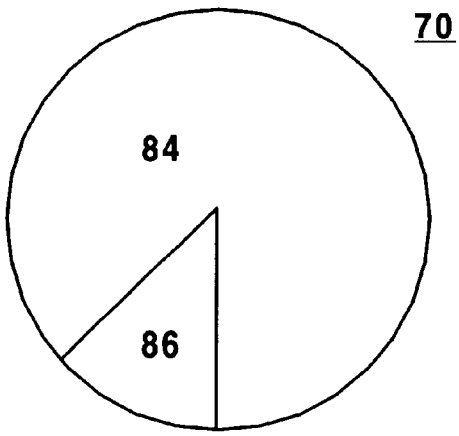

With reference to FIG. 5C, there is depicted a wafer 70 where the values for the sensed electrical characteristics of the individual integrated circuits on the wafer 70 vary by wedge shaped region. It is appreciated that even though the wedge shaped region depicted in Fig. 5A is very uniform and has very smooth edges, in actual application the region may not be so uniform or have such smooth edges. Further, the wedge shaped region may enclose either a smaller or a larger area, be disposed at any radial angle, or extend fully or only partially to the edges or the center of the wafer 70. Thus, the depiction of FIG. 5C is for purposes of example only, and is not intended to limit the scope of the application of the invention to the exact example depicted.

To continue the example, the electrical characteristics of the integrated circuits within region 86 of the wafer 70 may have values that are generally higher than those within region 84 of the wafer 70. Because of the difference in the values of the electrical characteristics of the integrated circuits within these regions, consideration of all of the values as a single group may tend to falsely indicate a high degree of variability within the group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 84 and 86 are selected as separate subsets before continuing with the analysis of the integrated circuits within the regions.

Figure 5D:
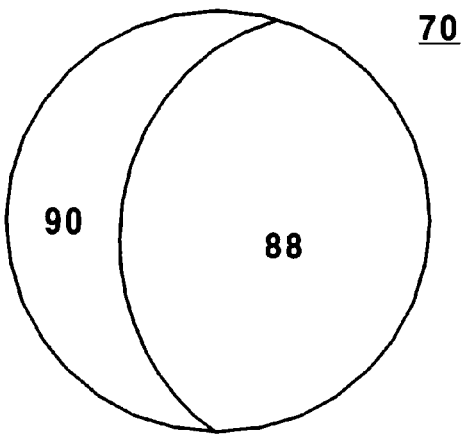

With reference to FIG. 5D, there is depicted a wafer 70 where the values for the sensed electrical characteristics of the individual integrated circuits on the wafer 70 vary by crescent shaped region. It is appreciated that even though the crescent shaped region depicted in FIG. 5D is very uniform and has very smooth edges, in actual application the region may not be so uniform or have such smooth edges. Further, the crescent shaped region may extend to a greater or a lesser extent across the surface of the wafer, and be disposed at any angular orientation. Thus, the depiction of FIG. 5D is for purposes of example only, and is not intended to limit the scope of the application of the invention to the exact example depicted.

To continue the example the electrical characteristics of the integrated circuits within region 90 of the wafer 70 may have values that are generally higher than those within region 88 of the wafer 70. Because of the difference in the values of the electrical characteristics of the integrated circuits within these regions, consideration of all of the values as a single group may tend to falsely indicate a high degree of variability within the group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 88 and 90 are selected as separate subsets before continuing with the analysis of the integrated circuits within the regions.

Figure 5E:
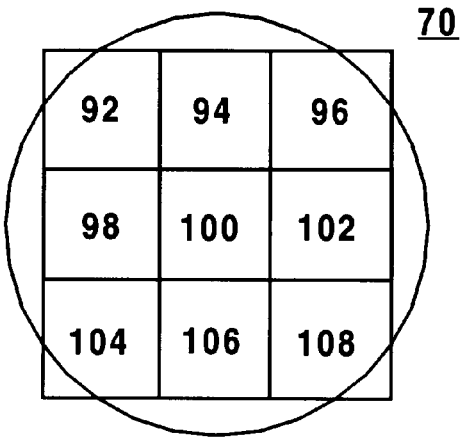

With reference to FIG. 5E, there is depicted a wafer 70 where the values for the sensed electrical characteristics of the individual integrated circuits on the wafer 70 vary by stepper region. Similar to that as mentioned above, the stepper regions depicted in FIG. 5E are by way of example only, and other sizes, numbers, and arrangements of stepper regions are contemplated as well. The electrical characteristics of the integrated circuits within various ones of the regions 92–108 of the wafer 70 may have values that are generally higher or lower than those within others of the regions 92–108 of the wafer 70.

Because of the difference in the values of the electrical characteristics of the integrated circuits within these various regions, consideration of all of the values as a single group may tend to falsely indicate a high degree of variability within the group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 92–108 are selected as separate subsets before continuing with the analysis of the integrated circuits within the regions.

Figure 5F:
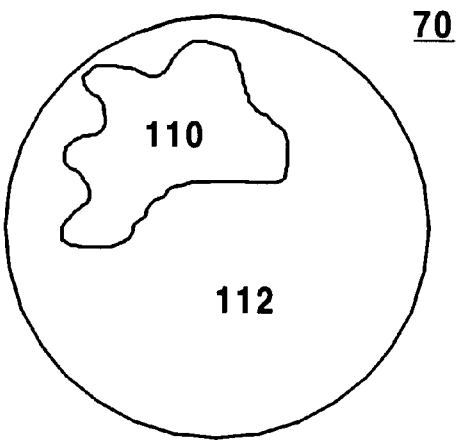

Finally, with reference to FIG. 5F, there is depicted a wafer 70 where the values for the sensed electrical characteristics of the individual integrated circuits on the wafer 70 vary by irregular contiguous region. As with the other types of regions described above, irregular contiguous region 110 may be of any size and shape, and is not limited to the specific embodiment of FIG. 5F. The electrical characteristics of the integrated circuits within region 110 of the wafer 70 may have values that are generally higher or generally lower than those within region 112 of the wafer 70.

Because of the difference in the values of the electrical characteristics of the integrated circuits within these regions, consideration of all of the values as a single group may tend to falsely indicate a high degree of variability within the group, whereas in actuality there may be a very low degree of variability within the separate regions of the wafer 70. Thus, detecting these regions and considering them separately tends to improve the results of the subsequent analysis, as described more completely below. Therefore, in the preferred embodiment, regions 110 and 112 are selected as separate subsets before continuing with the analysis of the integrated circuits within the regions.

Figures 4A, 4B:
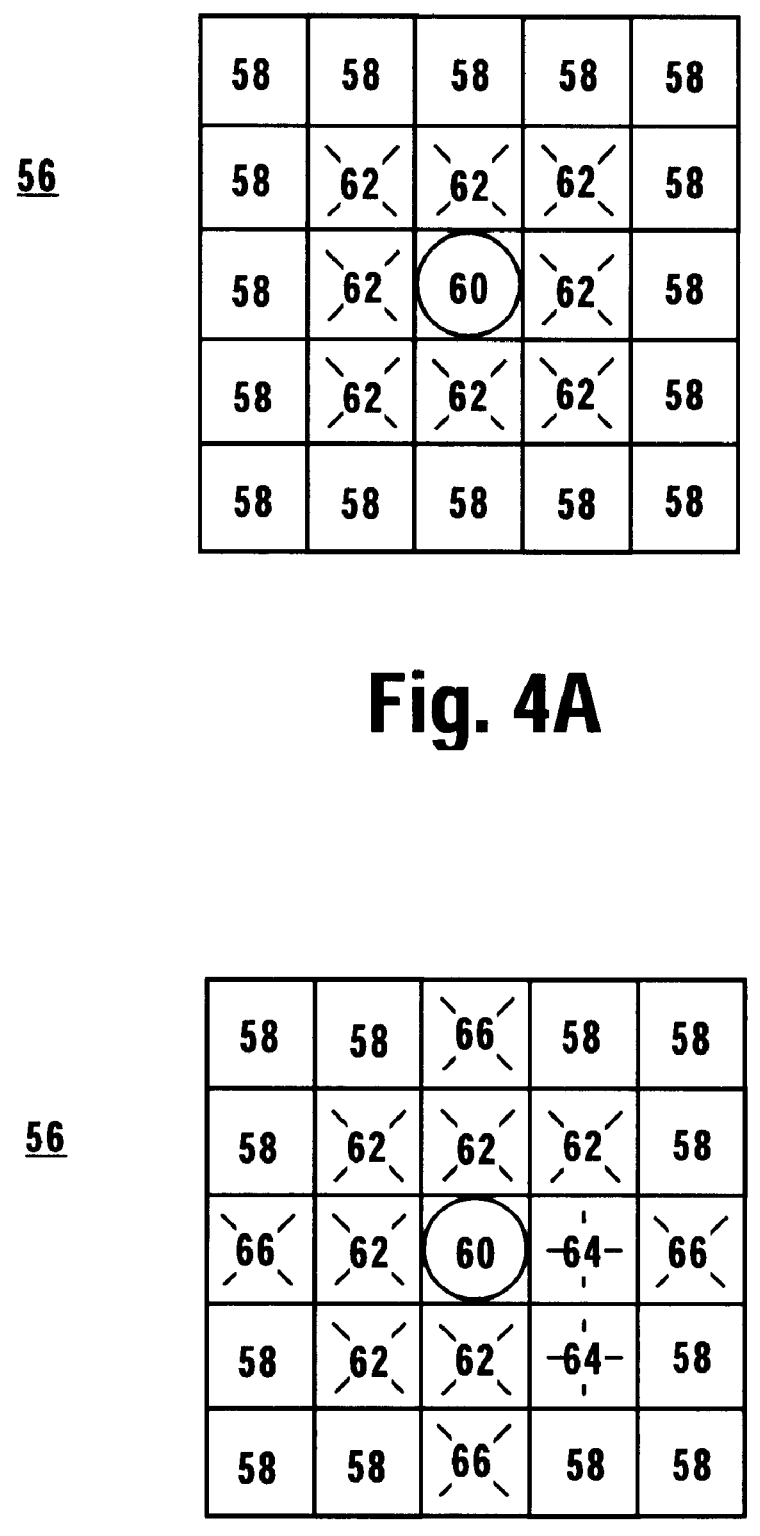

FIGS. 4A and 4B depict another method of selecting the subset of integrated circuits according to the present invention. FIGS. 4A and 4B depict a wafer section 56 with integrated circuits 58, 60, 62, 64, and 66. In this method as depicted in FIGS. 4A and 4B, the subset of integrated circuits for a first target integrated circuit 60 is the eight nearest neighbor integrated circuits 62 to the first integrated circuit 60. The other integrated circuits 58 are not considered in the subsequent analysis. The subset of integrated circuits for the second target integrated circuit is then the eight nearest neighbor integrated circuits to the second target integrated circuit, and so forth for all of the integrated circuits on a wafer.

As depicted in FIGS. 4A and 4B, only integrated circuits for which values of the electrical characteristic exist are used in the nearest neighbor analysis. For example, the two integrated circuits 64 do not have associated values for the electrical characteristic in question. In this case, the set of four integrated circuits 66 that are then the next nearest neighbors are used in the nearest neighbor calculation as described below. All four of the next nearest neighbor integrated circuits are used in such a situation, even if only one, two, or three more integrated circuits are required for the analysis of the eight nearest neighbor integrated circuits, so that the analysis is not skewed by a single additional nearest neighbor integrated circuit that might be an outlier, as described more completely below.

Thus, in the most preferred embodiment, at least eight nearest neighbor integrated circuits 62 are used for the analysis of each integrated circuit 60, and additional nearest neighbor integrated circuits 66 are preferably added in groups of four, unless one or more of the four additional groups of nearest neighbor-integrated circuits 66 also does not have the requisite associated electrical characteristic value.

The reference value to be used with the individual integrated circuit 60 being analyzed is determined by taking an average of the electrical characteristic value for the nearest neighbor integrated circuits 62, and 66 if applicable, while the electrical characteristic value for the individual integrated circuit 60 being analyzed is preferably not included in the mathematical manipulation to determine the reference value. While a variety of different averages could be used in alternate embodiments of the invention, in the preferred embodiment the median average is used as it tends to reduce the effect of outlier integrated circuits that may be included in the nearest neighbor subset of integrated circuits 62.

The electrical characteristic value for the integrated circuit 60 being analyzed is then compared to the reference value determined from the nearest neighbor subset of integrated circuits 62, to produce an offset value for the integrated circuit 60 being analyzed, such as the difference between the electrical characteristic value for the integrated circuit 60 being analyzed and the reference value determined from the nearest neighbor subset of integrated circuits. If there is more than one electrical characteristic value for each of the integrated circuits used in the analysis as described above, then the mean average of the characteristic values is used in the computations described above for each of the integrated circuits, both those in the nearest neighbor subset of integrated circuits 62, and the integrated circuit 60 being analyzed.

Yet another method that may be used to select a subset of integrated circuits is to retain in a database the historical output for wafers that have been previously tested, and to compare integrated circuits from a given wafer with those integrated circuits that occupy the same position on other wafers and not necessarily with the other integrated circuits on the same wafer. In this manner, the selected subset of integrated circuits is all integrated circuits within the database that occupy the same position on all of the wafers that have been tested.

It is appreciated that combinations of one or more the methods described above may be used to select the subsets of the integrated circuits. One of the goals of selecting the subsets is to reduce the degree of variation within the selected subsets, if that degree of variation is not attributable to defects within the integrated circuits. The subsets of integrated circuits are preferably detected and selected by the off-line binner 14, prior to performing the subsequent steps of the analysis, as described below.

The off-line binner 14 mathematically manipulates the data received from the wafer tester 12 to determine new pass and fail criteria for the integrated circuits, preferably based on the selected subsets of the integrated circuits. This is preferably accomplished by determining a reference value, against which the data points for the integrated circuits within the data set are compared. In a most preferred embodiment, the reference value is determined by computing an average for the selected subset. The average that is used is most preferably a median average, although in alternate embodiments a mean or mode average could be used. In further embodiments, a predetermined value, such as one determined through historical compilation of empirical data, could also be used.

By using an average of the selected subset as the reference value against which the integrated circuits are compared, the present method takes into account the specific processing that has been applied to the selected subset. For example, the selected subset may have electrical characteristics that are somewhat different than normal, because of the specific processing received, but which are not deleterious to the proper functioning of the integrated circuits within the selected subset, again because of the slight differences in the specific processing received by the selected subset.

The individual data points for the integrated circuits represented in the selected subset are compared to the reference value that has been determined as described above. This comparison may take one or more of several different forms. In a most preferred embodiment, the arithmetic difference between the reference value and each individual data point is determined. This difference then represents an offset between the reference value and the data point. The offset associated with each integrated circuit is then evaluated to determine whether it is greater than a given amount. If the offset is greater than the given amount, then the integrated circuit is binned as failing, and if the offset is less than the given amount then the integrated circuit is binned as passing, as described with more detail below.

The given amount against which the offset associated each integrated circuit is compared may be determined according to one or more of a variety of different methods. For example, in a preferred embodiment the given amount is statistically determined from the data points within the selected subset. This may be accomplished in a manner such as determining a variance within the selected subset, such as by determining the standard deviation of the selected subset, and using the standard deviation, or some other indication of variance, as the basis for the given amount. For example, the given amount may be set as equal to a three sigma value for the selected subset. In this example, those offsets that have an absolute value greater than the three sigma value are considered to be outliers, and are assigned failing binning codes by the off-line binner 14, and those offsets that have an absolute value that is less than the three sigma value are considered to have "normal" data parameters, and are assigned passing binning codes by the off-line binner 14. In yet an additional alternate embodiment, the given amount is based on a predetermined value, such as may be determined by historical empirical data.

In other embodiments, the given amount by which the outliers are determined may have a different value in different circumstances. For example, a first given amount may be used to evaluate those offsets that represent a data point that is greater than the reference value, and a second given amount may be used to evaluate those offsets that represent a data point that is less than the reference value. This embodiment may be preferred for those electrical characteristics that can tolerate a certain degree of variation above the reference value, and a different degree of variation below the reference value.

Further, a different value for the given amount may be used when changing the binning classification of an integrated circuit that has previously been binned, such as by a wafer tester 12. In this embodiment, a first given amount may be used to evaluate and possible reclassify a previously failing integrated circuit as a passing integrated circuit, and a second given amount may be used to evaluate and reclassify a previously passing integrated circuit as a failing integrated circuit. In this manner, the limits for rebinning the integrated circuits can be more narrowly tailored to favor either ensuring that as few as possible good devices are discarded as failures, or ensuring that as few as possible bad devices are passed as acceptable.

After the integrated circuits have been associated with binning data by the off-line binner 14, as described above, the data is again passed on the communication means 10 to a pick and place unit 16, which uses the binning data to remove the good integrated circuits from the dicing tape and stage them for packaging. Preferably, the integrated circuits that have been designated as failures by the off-line binner 14 remain on the dicing tape and are eventually discarded. By using the wafer map created by the off-line binner 14 as the indicator for which integrated circuits are good and which integrated circuits are bad, the pick and place unit 16 does not require the individual integrated circuits to be physically marked in any way, such as by an ink drop, in order to make the determination. This provides for a degree of freedom in reassigning the pass or fail classification of the integrated circuits during the analysis performed in the off-line binner 14.

Although this description generally describes the process and apparatus for determining passing integrated circuits and failing integrated circuits, it is appreciated that the invention is equally applicable to assigning differing passing codes to passing integrated circuits or differing failure codes to failing integrated circuits. For example, the method and apparatus described herein can not only assign failure codes as described, but can also assign a grade of passing code, where the grade of the passing code assigned relates to the magnitude of the offset between the value of the sensed parameter for the integrated circuit and the reference value. For example, integrated circuits with relatively smaller offsets may be assigned a passing code indicating a higher passing grade, where integrated circuits with relatively larger offsets, but not so large as to be classified as an outlier, may be assigned a passing code indicating a lower passing grade. This may be useful, for example, in applications where differing speeds of integrated circuits are desired.

Figure 3:
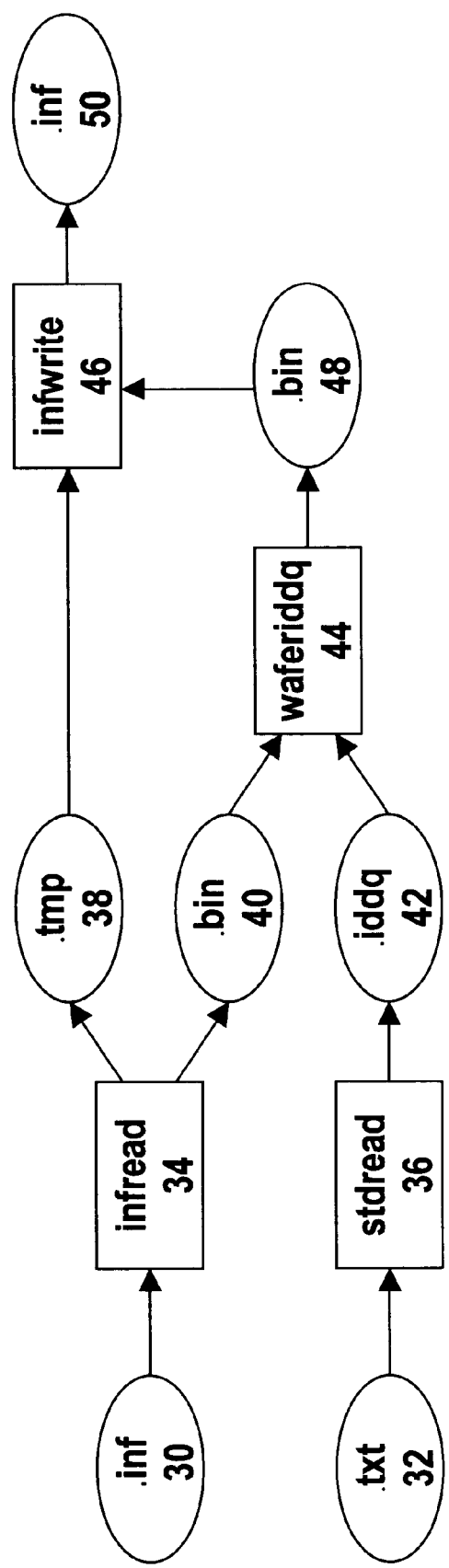
FIG. 3 is flow chart of a method for rebinning integrated circuits as passing or failing.

FIG. 3 is a flow chart of a more detailed embodiment of a computer program to accomplish the method of the present invention. The computer program is an instruction set residing on digital media for enabling a computing device to receive and analyze an ordered data set, as described below. The flowchart of FIG. 3 depicts the input and output files, designated as ellipses in FIG. 3, that are used and created by the different instruction set modules, designated as rectangles in FIG. 3. The collection of different instruction set modules is given the title of "Wafer Level Iddq." The Wafer Level Iddq bin analyzer program is a software tool, most preferably written in MATLAB, whose purpose is to analyze $I_{ddq}$ data and determine binning of integrated circuits based on comparison of IDDq based on position. Other software routines can also be written to apply the principles of the invention to characteristics of the integrated circuits other than Iddq. Therefore, the specific embodiment described below is representative of other programs that perform similar functions.

The Wafer Level Iddq bin analyzer is preferably comprised of four modules. A module named "infread" 34 reads an .inf file 30 and extracts the bin data from the wafer tester 12 into a more useable bin file 40, and a slightly modified .tmp file 38 that is used by a later module. A module named "stdread" 36 reads a .txt file 32 and extracts the Iddq data from the wafer tester 12 into a more useable .iddq file 42. The .inf file 30 and the .txt file 32 may be standard files that are created by a wafer tester 12 that operates in a traditional manner, with the exception that the wafer tester 12 preferably does not ink any of the integrated circuits that violate the predetermined expected limits programmed into the wafer tester 12. Alternately, the .inf file 30 and the .txt file 32 are produced by a wafer tester 12 that is not programmed with predetermined expected limits, and does not bin any of the integrated circuits that are tested. In this latter case, some of the procedures as described below are modified accordingly.

The core module "waferiddq" 44 reads in the .bin file 40 and .iddq file 42 generated by the infread module 34 and the stdread module 36 respectively, and outputs a modified .bin file 44 based on the $I_{ddq}$ data. A module named "infwrite" 46 reads in the .tmp file 38 and the bin file 48 and overwrites the updated binning information in the .tmp file 38 in an .inf file 50. The format of the .inf file 50 is preferably the same as the format of the .inf file 30, so that the .inf file 50 can be subsequently used in the same manner that the precursor .inf file 30 would have been used, had the data not been further processed as described herein. The specific functions of these different software modules are described in more detail below.

The infread module 34 extracts the binning data, such as pass and failure codes, for the integrated circuits that have been tested on a wafer tester 12. This data is contained in the .inf file 30, and may be formatted according to a standard industry specification. The bin data is preferably extracted from the .inf file 30 into a format that is more easily readable by the waferiddq module 44. This infread module 34 is preferably a separate software module from the waferiddq module 44 so that if the .inf file 30 format changes, modifications will only be needed in the infread module 34. However, in other embodiments, all of the functions of the various routines as described herein are contained within a single software module.

The infread module 34 is invoked by issuing the command "infread <filename.inf>" where <filename.inf> is preferably a standard .inf file, as described above. The infread module 34 outputs the .bin file 40, which contains the iBinCodeLast bin data from the .inf file 30, and also outputs the .tmp file 38 that contains all of the data of the original .inf file 30, with iBinCodeLast data renamed to iBinCodePreIDDQ. Defined variables preferably include ROWS, which is the number of rows of bin data in the .inf file 30, and COLS, which is the number of columns of bin data in the .inf file 30.

In a most preferred embodiment, the infread module 34 works by scanning in the .inf file 30 and outputting the .tmp file 38 until the iBinCodeLast tag is identified. Instead of outputting the iBinCodeLast tag, the iBinCodePreIDDQ tag is output instead. Then the bin data is preferably read into a 2-dimensional array. Because later data replaces earlier data, if there are multiple sets of iBinCodeLast data, then the last data set .inf the .inf file 30 is preferably the final result that is output. Finally, the bin data is output to the bin file 40 in transverse order (highest row and column first) to correspond to the format of the .inf file 30.

The stdread module 36 is used to extract the $I_{ddq}$ data from the .txt file 32 into a format that is more easily readable by the waferiddq module 44. The stdread module 36 is preferably separate from the waferiddq module 44 so that if the format of the .txt file 32 changes, modifications are only needed in the stdread module 36. However, as mentioned above, the various modules may alternately be incorporated into a single module. The stdread module 36 extracts the data for the tests with unique names that contain the string "IDDQ." In the case of multiple tests with the same name, only the first one is read in by the stdread module 36.

The stdread module 36 is invoked by issuing the command "stdread <filename.txt>," where <filename.txt> is a modified text-based .std file. The stdread module 36 outputs the iddq file 42, which contains the $I_{ddq}$ data from the .txt file 32. The format of the .iddq file 42 is: X-coord, Y-coord, IDDQ1 IDDQ2, IDDQ3, . . . , IDDQN, where the data is written in a tab separated format.

Two passes are preferably made through the .txt file 32 by the stdread module 36. The first pass through the .txt file 32 reads in all of the data with the "TSR.test_num" tag (the test numbers) and then scans through them for the pattern "IDDQ." If this pattern is found, the part of the test name after "IDDQ" is compared with the previously accepted test names, and if it does not match any, then this test number is accepted as an $I_{ddq}$ test. The result of this scheme is that only the first of each test with the same name is read in. For example, if "PRE_IDDQ1" is read in first and "POST_IDDQ1" second, the "POST_IDDQ1" test is ignored. Any subsequent tests with the name "PRE_IDDQ1" are also ignored.

The second pass through the .txt file 32 scans for "PTR.test" tags. When the stdread module 36 finds a PTR.test tag, it reads in the test number and determines whether it represents an $I_{ddq}$ test, as determined by the first pass through. If it is $I_{ddq}$ test data, then the $I_{ddq}$ test data is stored in a temporary array. When a "PRR.x_coord" tag is encountered, the stdread module 36 knows that all the data has been read in for a particular integrated circuit location. The X-coordinate and Y-coordinate for that integrated circuit is read in, and then outputted to the .iddq file 42 along with the stored $I_{ddq}$ vector data for that location. The data in the .txt file 32 is typically stored in amps, but for the .iddq file 42, these values are preferably multiplied by one million to yield units of micro amps. If data is not present for a particular vector, a zero is inserted instead.

The waferiddq module 44 is the core module for the delta $I_{ddq}$ analysis procedure. The waferiddq module 44 takes in $I_{ddq}$ data and previously specified binning data, such as from the wafer tester 12, if any, and modifies the bin data based on an analysis of the $I_{ddq}$ data. This analysis preferably includes the detection and selection of relevant subsets of data from the integrated circuits, as described above. The waferiddq module 44 is invoked by issuing the command "waferiddq <filename.iddq> <filename.bin>," where <filename.iddq> is the .iddq file 42 output by the stdread module 36 and <filename.bin> is the bin file 40 output by the infread module 34. The waferiddq module 44 outputs the bin file 48 containing modified binning data for the integrated circuits.

In the preferred embodiment, the threshold or offset value used to rebin a failing device as a passing device can be different from the threshold of offset value used to rebin a passing device as a failing device. In various embodiment, these offsets can be predetermined values, such as values based on empirical data, or they can be statistically determined from the current data set, such as a three sigma limit. Further, the reference value by which the deviation of the individual integrated circuits is measured may also be a predetermined value, such as determined by empirical data, or it can be a statistically determined value from the current data set, such as a mean, median, or mode average of the current data set.

The infwrite module 46 is used to insert the bin data from the bin file 48 generated by the waferiddq module 44 into the .tmp file 38 generated by the infreadmodule 34. The result is an .inf file 50, wherein the binning of the integrated circuits has been updated as explained above, based on the analysis of the $I_{ddq}$ data. The infwrite module 46 is preferably separate from the waferiddq module 44 so that if the desired format of the .inf file 50 changes, modifications are only needed in the infwrite module 46. However, as mentioned above, all of the modules may be contained within a single module in an alternate embodiment.

The infwrite module 46 is invoked by issuing the command "infwrite <filename.tmp> <filename.bin>," where <filename.tmp> is the .tmp file 38 output by the infread module 34, and <filename.bin> is the corresponding .bin file 48 output by the waferiddq module 44. The infwrite module 46 outputs an .inf file 50 containing the original iBinCodeLast maps renamed to iBinCodePreIDDQ, along with the new iBinCodeLast map based on the modifications to the binning codes made by the waferiddq module 44. Defined variables include ROWS, which is the number of rows of bin data in the .inf file 50, and COLS, which is the number of columns of bin data in the .inf file 50.

The bin data is read in as ordered in the .bin file 48. One pass is made through the .tmp file 38 to determine where to insert the new iBinCodeLast data, as there can be multiple iBinCodePreIDDQ sections. Then a second pass is made through the .tmp file 38, which outputs the .inf file 50 until the point is reached as determined in the first pass through. Then the new bin data from the bin file 48 is preferably output to the .inf file 50 in a standard .inf file format, similar or identical to that of the original .inf file 30. The remainder of the .tmp file 38 is then output to the new .inf file 50.

Program code in MATLAB for a preferred embodiment of the waferiddq module 44 described above is given below.

```
% Input:    File column data each row is one die location on wafer
%           one row (record) is IDDQ data for all IDDQ vectors
% Output:   Histogram distributions of the die IDDQ average,
%           die nearest neighbor residual (NNR), and rebin of die
%
% Nearest Neighbor Estimate (NNE)
% Nearest Neighbor Residuals (NNR)
%
% The flow of the routine is
%
%    For each wafer
%        Extract wafer data
%
%        For each die on wafer
%            Compute average IDDQ over vectors
%            Compute Nearest Neighbor estimate as median of
%            the 8 die closest to current die (exclude current die)
%            Compute Residual (Original Average – NN estimate)
%
%            Rebin die based on NNR
%            Display results for wafer
%
%=========================================================
clear all;
%=========================================================
% User Specified Parameters
%=========================================================
TV = –1; % TV = –1 means average over all test vectors, otherwise TV
index
```

-continued

```
OFF = -1;
AL = 90;
RL = -1;
%========================================================
% Load File & Extract Wafer Data
%========================================================
%stLotName = 'GAB41800';
%stFileName = 'PBAJU263SJF1'; % GAB41800
%stFileName = 'PBAJU322SJE1'; % GAB41800
%stLotName = 'GAC03051';
%stFileName = 'LSAJA822SWC4'; %GAC03051.1
%stFileName = 'LSAJA823SWG6'; %GAC03051.1
%stLotName = 'GAB41805.1';
%stFileName = 'PBAIJ260SJA0'; % GAB41805.1
%stFileName = 'PBAIJ302SJC6'; % GAB41805.1
stLotName = 'GAB41805.1';
stFileName = 'PBAIJ260SJA0V2'; % GAB41805.1
%stFileName = 'PBAIJ302SJC6V2'; % GAB41805.1
WF = 260;
%stLotName = 'GAB41806';
%stFileName = '7FEBB110MMA0'; % GAB41806.1
%stFileName = '7FEBB123MMC4'; % GAB41806.1
%stFileName = 'PBARI124SJE3'; % GAC13052.1
%stLotName = 'GAC13052'; % Lot Name
%WF        = 154;
%WF        = 124;
%WF        = 14;
%WF        = 132;
if WF==302 | WF==260,
        AL = 100;
        RL = 8;
        HS = 1;
        end;
fprintf('Loading file . . . ');
LOT     = load([stFileName '.txt']);
fprintf('done.\n');
if max(LOT(:,4))<=14 & min(LOT(:,4))>=1, % Is Bin info in
4th Column?
        stLotName = stFileName;
        stWaferName = sprintf('%d',WF);
        [nr,nc]   = size(LOT);
        k         = 1:nr;
        i1        = k(LOT(:,1)==WF);
        W         = LOT(i1,2:nc);
else
        W = LOT;
        stWaferName = stFileName;
        end;
%========================================================
% Print Stats
%========================================================
fprintf('File Name   : %s\n',stFileName);
fprintf('Lot Name    : %s\n',stLotName);
fprintf('No. Wafers  : %d\n', length(unique(LOT(:,1))));
fprintf('Wafer Number : %d\n', WF);
if TV==-1,
        fprintf('Test Vector  : All\n');
else
        fprintf('Test Vector  : %d\n',TV);
        end;
%========================================================
% Extract Wafer Image
%========================================================
Xmin = min(W(:,1));
Ymin = min(W(:,2));
Xmax = max(W(:,1));
Ymax = max(W(:,2));
NX = Xmax - Xmin + 1;
NY = Ymax - Ymin + 1;
[NR,NC] = size(W);
X = W(:,1); % X-location
Y = W(:,2); % Y-location
P = W(:,3); % Pass/Fail
I = zeros(NR,1);
NI = zeros(NR,1);
if TV==-1,
        w         = sum(W(:,4:NC)' );
        s         = sum(W(:,4:NC) '>0);
        NI        = s';
        I (s> 0) = (w(s>0)./s(s>0))';
        I (s==0) = OFF;
else
        I = W(:,3+TV)
        NI = ones(NR,1);
        end;
F = sum(W(:,4:NC) '>AL);
FI = OFF*ones(NY,NX);
WI = OFF*ones(NY,NX);    % Wafer Image
NV = zeros(NY,NX);       % Number of Vectors
for cnt2 = 1:NR,
            yi = Y(cnt2)-Ymin+1;
            xi = X(cnt2)-Xmin+1;
            WI(yi, xi) = I (cnt2);
            NV(yi, xi) = NI(cnt2);
            FI(yi, xi) = F (cnt2);
            end;
%========================================================
% Mean IDDQ for Full Test Vector Sets
%========================================================
IM       = OFF*ones(size(WI));
[NR,NC]  = size(W);
ind      = NV==NC-3;
IM(ind)  = WI(ind);
%========================================================
% Mean IDDQ for All Test Vector Sets
%========================================================
IM = WI;
%========================================================
% Number in each Mean
%========================================================
IM = NV;
%========================================================
% Nearest Neighbor Estimate
%========================================================
IA       = OFF*ones(size(WI));
[NR,NC]  = size(W);
ind      = NV==NC-3;
IA(ind)  = WI(ind);
NN       = OFF*ones(size(WI));
ntv      = NC-3; % Number of test vectors
w        = sum(W(:,4:NC)' );
s        = sum(W(:,4:NC) '>0);
k        = (1:NR)';
wi       = k(s==ntv); % Indices of wafers interested in
iddq     = w(wi)./s(wi);
NNI = 8;
for c1 = 1:length(wi),
        id = wi(c1);
        d = sqrt((W(id;1)-W(wi,1)).^2 + (W(id,2)-W(wi,2)).^2);
        ds = sort(d);
        yi = Y(id)-Ymin+1;
        xi = X(id)-Xmin+1;
        NN(yi, xi) = median(iddq(d>0 & d<=ds(NNI)));;
        end;
%========================================================
% Residual
%    Only for die with all test vectors
%========================================================
IM = IA-NN;
IM(NN==OFF) = 0;
IM(IA==OFF) = 0;
%========================================================
% Number of Vectors Failed
%========================================================
IM = FI;
for c1 = 1:NX,
        for c2 = 1:NY,
                x = Xmin + c1-1;
                y = Ymin + c2-1;
                if IM(c2,c1)>0,
                        fprintf('x:%f y:%f
nf:%d\n',x+0.4,y,int2str(IM(c2,c1)));
                        end;
                end;
        end;
%========================================================
% Rebin Map
%========================================================
```

-continued

```
R = IA−NN;
R(NN==OFF) = 0;
R(IA==OFF) = 0;
NL = sum(sum(R~=0)); % Number of Die Labels
DL = zeros(NL,3); % Die Labels
CL = 0;
if RL<0,
        nd = sum(F>0);
        nv = sum(sum(IA~=OFF));
        sr = sort(reshape(R(IA~=OFF),nv,1));    % Sorted Residual
        RL = (sr(nv−nd) + sr(nv−nd+1))/2;       % Residual Threshold
        end;
fprintf('No. Die Failing Absolute Limit:   %3d\n',sum(sum(FI>0)));
fprintf('No. Die Failing Residual Limit:   %3d\n',sum(sum( R>RL)));
fprintf('No. Die Evaluated             :   %3d\n1,sum(sum(IA~=OFF)));
%==========================================================
% IDDQ Distribution
%==========================================================
I = IA;
[nr,nc] = size(I);
I = reshape(I,nr*nc,1);
I = I(I~=OFF);
fprintf('IDDQ Variance      : %6.3f\n',var(I));
fprintf(' 5−95 Range        : %6.3f\n',Percentile(I,0.95)−
Percentile(I,0.05));
fprintf('10−90 Range        : %6.3f\n',Percentile(I,0.90)−
Percentile(I,0.10));
%==========================================================
% Residual Distribution
%==========================================================
R = IA−NN;
R(NN==OFF) = 0;
R(IA==OFF) = 0;
[nr,nc] = size(R);
R = reshape(R,nr*nc,1);
R = R(R~=0);
fprintf('Residual Variance:   %6.3f\n',var(R));
fprintf(' 5−95 Range        : %6.3f\n',Percentile(R,0.95)−
Percentile(R,0.05));
fprintf('10−90 Range        : %6.3f\n',Percentile(R,0.90)−
Percentile(R,0.10));
```

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method for testing integrated circuits having associated position designations, the improvement comprising:
   a. introducing a predetermined set of input vectors as test input into the integrated circuits,
   b. sensing output from the integrated circuits in response to the predetermined set of input vectors,
   c. recording the output from the integrated circuits in a wafer map, referenced by the position designations,
   d. selecting the output from at least a subset of the integrated circuits,
   e. mathematically manipulating the output of the selected subset of integrated circuits to produce a reference value,
   f. individually comparing the output for each of the integrated circuits in the selected subset to the reference value,
   g. identifying graded integrated circuits within the selected subset that have output that differs from the reference value by more than a given amount, and
   h. assigning a classification to the graded integrated circuits.

2. The method of claim 1, further comprising the step of recording the classification for the graded integrated circuits in the wafer map, referenced by the position designations for the graded integrated circuits.

3. The method of claim 1, wherein steps a, b, and c are accomplished by a wafer tester and all other steps are accomplished by an off-line binner.

4. The method of claim 1, wherein the associated position designations further comprise row and column coordinates of the integrated circuits based on locations of the integrated circuits on a wafer.

5. The method of claim 1, wherein the given amount used to identify the graded integrated circuits further comprises a predetermined value.

6. The method of claim 1, wherein the given amount used to identify the graded integrated circuits further comprises a value based on a degree of variation within the output for the selected subset of integrated circuits.

7. The method of claim 1, wherein the selected subset further comprises an annular band of the integrated circuits, where the annular band is selected to reduce variance of the output within the selected subset.

8. The method of claim 1, wherein the selected subset further comprises a linear band of the integrated circuits, where the linear band is selected to reduce variance of the output within the selected subset.

9. The method of claim 1, wherein the selected subset further comprises a radial wedge of the integrated circuits, where the radial wedge is selected to reduce variance of the output within the selected subset.

10. The method of claim 1, wherein the selected subset further comprises a crescent band of the integrated circuits, where the crescent band is selected to reduce variance of the output within the selected subset.

11. The method of claim 1, wherein the selected subset further comprises a contiguous region of the integrated circuits, where the contiguous region is selected to reduce variance of the output within the selected subset.

12. In a method for testing integrated circuits, the improvement comprising:
   a. introducing a predetermined set of input vectors as test input into the integrated circuits,
   b. sensing output from the integrated circuits in response to the predetermined set of input vectors,
   c. recording the output from the integrated circuits in a wafer map, referenced by position designations,
   d. individually comparing the recorded output for each of the integrated circuits to a predetermined expected output value,
   e. assigning a classification to the integrated circuits that violate the predetermined expected output value,
   f. recording the classification in the wafer map for the integrated circuits that violate the predetermined expected output value, referenced by position designations,
   g. selecting the output from at least a subset of the integrated circuits,
   h. mathematically manipulating the output of the selected subset of integrated circuits to produce a reference value, i. individually comparing the output for each of the integrated circuits in the selected subset to the reference value, j. identifying graded integrated circuits within the selected subset that have output that differs from the reference value by more than a given amount, k. assigning an adjusted classification to the graded integrated circuits, and l. correcting the recorded, classifications to agree with the adjusted classifications.

13. The method of claim 12, wherein the given amount used to identify the graded integrated circuits further comprises a value based on a degree of variation within the output for the selected subset of integrated circuits.

14. An instruction set residing on a digital recording media, the instruction set for enabling a computing device to receive and analyze an ordered data set containing individual data points from a wafer tester relating to electrical characteristics of integrated circuits, and for enabling the computing device to associate codes with selected ones of the integrated circuits, the instruction set comprising:

input instructions for receiving the ordered set of data from the wafer tester, selection instructions for selecting the individual data points associated with at least a subset of the integrated circuits, computational instructions for mathematically manipulating the individual data points associated with the subset of the integrated circuits to produce a reference value, comparison instructions for comparing the individual data points associated with the subset of the integrated circuits to the reference value to identify individual data points that differ from the reference value by more than a given amount, binning instructions for associating the codes with the integrated circuits that have individual data points that differ from the reference value by more than the given amount, and output instructions for outputting the codes with the ordered data set.

15. The instruction set of claim 14, wherein the reference value used to associate the codes with the integrated circuits further comprises a value based on an average of the individual data points.

16. The instruction set of claim 14, wherein the given amount used to associate the codes with the integrated circuits further comprises a value based on a degree of variation within the individual data points.

17. The instruction set of claim 14, wherein the selection instructions further comprise instructions for selecting the subset of integrated circuits based on geographical location of the integrated circuits on the wafer.

18. The instruction set of claim 14, wherein the selection instructions further comprise instructions for selecting the subset of integrated circuits based on reducing variance between the individual data points of the selected subset of integrated circuits.

19. The instruction set of claim 14, wherein:

the selection instructions further comprise instructions for selecting the individual data points associated with a subset of the integrated circuits, where the subset of the integrated circuits constitute at least a given number of geographical nearest neighbor integrated circuits to a target integrated circuit, and the comparison instructions further comprise instructions for comparing the individual data points associated with the target integrated circuit to the reference value to determine whether the individual data points associated with the target integrated circuit differ from the reference value by more than a given amount.

20. The instruction set of claim 14, wherein the selection instructions further comprise instructions for selecting a contiguous region of the integrated circuits, where the contiguous region is selected to reduce variance between the individual data points of the selected subset of integrated circuits.

* * * * *